United States Patent [19]

Boeckmann

[11] Patent Number: 4,600,876

[45] Date of Patent: Jul. 15, 1986

[54] INTEGRATED BOOTSTRAP BIAS CIRCUIT

[75] Inventor: Eduard F. B. Boeckmann, Huntsville, Ala.

[73] Assignee: GTE Communication Systems Corp., Northlake, Ill.

[21] Appl. No.: 779,003

[22] Filed: Sep. 23, 1985

[51] Int. Cl.[4] ............................................. G05F 3/22
[52] U.S. Cl. .................................... 323/311; 323/901; 307/564
[58] Field of Search ............... 323/311, 312, 901, 907; 307/296 R, 297, 544, 558, 564

[56] References Cited

U.S. PATENT DOCUMENTS

| | | | |
|---|---|---|---|
| 3,369,129 | 2/1968 | Wolterman | 323/312 X |
| 3,521,087 | 7/1970 | Lombardi | 307/564 |
| 3,536,986 | 10/1970 | Perlman | 323/312 |
| 4,224,539 | 9/1980 | Musa et al. | 323/311 X |
| 4,339,677 | 7/1982 | Hoeft | 307/564 |

FOREIGN PATENT DOCUMENTS

| | | | |
|---|---|---|---|
| 0001769 | 1/1981 | Japan | 323/312 |
| 0081622 | 5/1982 | Japan | 323/312 |

*Primary Examiner*—Peter S. Wong
*Attorney, Agent, or Firm*—Robert J. Black; Gregory G. Hendricks

[57] ABSTRACT

The present invention consists of a subcircuit which may be employed in integrated circuit technology to provide the necessary drop from a relatively high voltage source and to provide base current for biasing of associated transistorized circuitry. Each subcircuit employs four transistors and one resistor and provides an effective drop from approximately 1.1 volts when it is desired to provide at least 2 microamps of bias circuit. Additional subcircuits of similar configuration can be placed in series with the present circuitry to increase the amount of voltage drop in accordance with the requirements of the associated circuitry.

8 Claims, 1 Drawing Figure

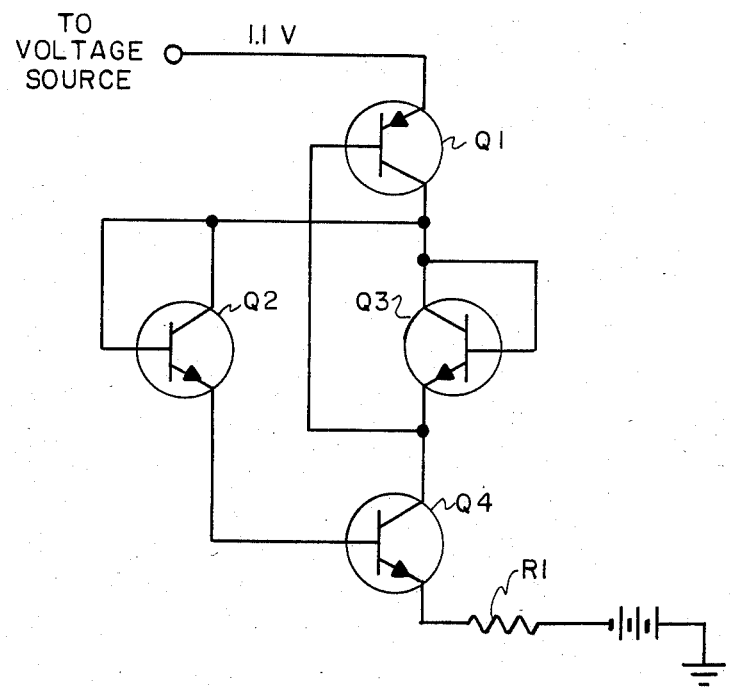

INTEGRATED BOOTSTRAP BIAS CIRCUIT

BACKGROUND OF THE INVENTION

1. Technical Field

The present invention relates to linear integrated circuits, designed primarily for consumer products where a battery is used to supply backup or operating power. More particularly the present invention provides a means of obtaining low level bias current without the use of high value voltage dropping resistors in the integrated circuit.

2. Background Art

It is frequently necessary to provide a bias current for an integrated circuit, of a few microamps from a relatively high voltage source such as a 9 volt battery, without utilizing high value voltage dropping resistors. For example, in a bi-polar integrated circuit resistor values above approximately 10,000 Ohms are costly in terms of area required and possible poor stability characteristics. At the same time the only available source of power may be a battery of relatively high voltage. It therefore becomes necessary to obtain the bias current by means of some circuitry which will not require the aforementioned high value resistors.

Since transistors are more economical of space it makes sense to use transistors as a method of providing the required current. One method would be to use a conventional current source design. A current source circuit of the prior art usually requires a reference current and therefore is wasteful of battery power in the event a battery source is used. A more desirable circuit is one which is self starting (boot-strapping) and does not "use" any current other than what is "delivered" to the load circuit. Another requirement of the circuit is that it have reasonable temperature stability so that at most only one order of magnitude of current change occurs over a temperature range for example of 0 degrees to 50 degrees Centigrade.

This degree of preciseness of the current is not a requirement since the circuit merely has to produce a certain minimum of current, e.g. 0.2 microamps at the worst case temperature (0° C.) for allowing start up of an operating circuit when power first becomes available. Such circuitry is allowed to have as much as 15 microamps at the worst case or high temperature e.g. 50° C. The invention described herein meets such requirements.

SUMMARY OF THE INVENTION

The present invention consists of a string of "N" sections of a subcircuit connected in series. Each subcircuit operates on approximately 1.1 volt potential. Therefore as an example, if a 9 volt battery is the only source and is required to deliver at least 2 microamps to a potential of 1.3 volts above common, then seven subcircuits are required to drop from the 9 volts down to 1.3 volts and deliver the 2 microamps of current.

Each subcircuit consists of four (4) transistors and one (1) resistor. The first transistor consists of a PNP device with its emitter connected to the source of current (this source may be another circuit or the primary source) and its collector connected to the collectors of the second and third transistors which are NPN devices. The base of the first transistor derives its bias potential for turn on, from a lower potential point in the circuit at the emitter of the third transistor which is also the connection point for the collector of the fourth transistor.

The second transistor which is an NPN device is diode-connected, that is to say its base and collector are directly tied together. The emitter of this transistor feeds bias current to the base of the fourth transistor from the collector of the first transistor. The third transistor is also a diode connected transistor that feeds the main current stream from the first transistor to the fourth transistor. The fourth and final transistor of the subcircuit is an NPN device. This transistor gates all the current to a resistor which in turn feeds current to common or the next subcircuit. The resistor, the only one in the subcircuit is of a medium value, e.g. 10,000 Ohms and provides stabilization for the fourth transistor.

BRIEF DESCRIPTION OF THE DRAWINGS

The single sheet of accompanying drawings is a schematic circuit diagram of a typical subcircuit structure and included devices as utilized in an integrated bootstrap bias circuit in accordance with the present invention.

DESCRIPTION OF THE PREFERRED EMBODIMENT

Referring now to the attached figure of drawings, a typical subcircuit or "N" section is shown. The invention as noted previously consists in using one or more of said such subcircuits depending on the value of source voltage. For example if the source voltage is 9 volts in a desire to provide a derived source of 2 microamps of 1.3 volts potential, and seven such subcircuits as shown in the accompanying drawing would be employed, with each subcircuit dropping the voltage by approximately 1.1 volts, to achieve the desired level in current, thus no high value resistors are employed as are more typically found in the usual dropping arrangement. Only a single, medium, value resistor e.g., one having a value of 10,000 Ohms is used per subcircuit along with four transistors Q1, Q2, Q3 and Q4.

The present circuit is relatively temperature stable and will self bootstrap or start operating on initial application of source potential.

This makes the circuit ideal for self biasing and start up applications. As shown in FIG. 1, transistor Q1 derives its bias potential from a lower potential point in the circuit namely at the emitter of transistor Q3. Transistor Q1 acts as the first current gating element in the subcircuit. Transistors Q2 and Q3 are both diode connected transistors, each providing one diode drop in potential, although transistor Q2 also acts as a bias current source for transistor Q4. Transistor Q4 acts as the final current gating element in the subcircuit. Resistor R1 acts as an emitter swamping resistor for stabilization. In summary the principle of the present invention is a temperature stable circuit that provides self-start up bias current without the use of large value resistors thus lending itself to integrated circuit technology. Efficiency or effective utilization of battery current is also a feature.

What is claimed is:

1. A voltage dropping circuit useful in providing low level bias current comprising:
   a voltage source;
   first, second, third and fourth transistors each including base, emitter and collector electrodes;
   said first transistor emitter connected to said voltage source;

the collector and base of both said second and said third transistor connected to the collector of said first transistor;

the base of said first transistor connected to said third transistor emitter in common with said fourth transistor collector;

said second transistor emitter connected to said fourth transistor base;

output means; and resistance means connected between said fourth transistor emitter and said output means;

whereby said circuit operates to drop the voltage of said source at said output a predetermined amount.

2. A voltage dropping circuit as claimed in claim 1, wherein: said first transistor is of the PNP type and said second, third and fourth transistors are of the NPN type.

3. A voltage dropping circuit as claimed in claim 1, wherein: the base of said first transistor derives its bias potential for operation from the emitter of said third transistor.

4. A voltage dropping circuit as claimed in claim 1, wherein: the emitter of said second transistor provides bias current for the base of said fourth transistor, derived from the collector of said first transistor.

5. A voltage dropping circuit as claimed in claim 1, wherein: said third transistor is operated to conduct current from said first transistor collector to said fourth transistor collector.

6. A voltage dropping circuit as claimed in claim 1, wherein: said fourth transistor gates current to said resistor which feeds current to said output means.

7. A voltage dropping circuit as claimed in claim 1, wherein: said resistance means acts as an emitter swamping resistor for said fourth transistor, stabilizing said circuit.

8. A voltage dropping circuit as claimed in claim 1, wherein: there are further included a plurality of additional ones of said subcircuits each with the first transistor emitter connected to the output of a different one of said subcircuits in series, wherein each of said subcircuits operates to drop the voltage of said source a predetermined amount.

* * * * *